United States Patent
Miyanaga et al.

(10) Patent No.: US 8,900,362 B2
(45) Date of Patent: Dec. 2, 2014

(54) MANUFACTURING METHOD OF GALLIUM OXIDE SINGLE CRYSTAL

(75) Inventors: Akiharu Miyanaga, Hadano (JP); Tatsuya Honda, Isehara (JP); Takatsugu Omata, Isehara (JP); Yusuke Nonaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 883 days.

(21) Appl. No.: 13/042,691

(22) Filed: Mar. 8, 2011

(65) Prior Publication Data

US 2011/0220011 A1 Sep. 15, 2011

(30) Foreign Application Priority Data

Mar. 12, 2010 (JP) ................................. 2010-056118

(51) Int. Cl.
  *C30B 23/04* (2006.01)
  *C30B 1/04* (2006.01)
  *C30B 29/16* (2006.01)

(52) U.S. Cl.
  CPC .. *C30B 1/04* (2013.01); *C30B 29/16* (2013.01)
  USPC ............ 117/105; 117/108; 117/109; 117/952

(58) Field of Classification Search
  USPC ................... 117/105, 108, 109, 952
  See application file for complete search history.

(56) References Cited

U.S. PATENT DOCUMENTS

| | | | |
|---|---|---|---|
| 4,873,833 A * | 10/1989 | Pfeiffer et al. | 62/55.5 |
| 5,731,856 A | 3/1998 | Kim et al. | |
| 5,744,864 A | 4/1998 | Cillessen et al. | |
| 5,869,363 A | 2/1999 | Yamazaki et al. | |
| 6,204,101 B1 | 3/2001 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Bob M Kunemund

(74) *Attorney, Agent, or Firm* — Eric J. Robinson; Robinson Intellectual Property Law Office, P.C.

(57) ABSTRACT

A method of growing a single crystal of gallium oxide at a lower temperature than the melting point (1900° C.) of gallium oxide is provided. A compound film (hereinafter referred to as "gallium oxide compound film") containing Ga atoms, O atoms, and atoms or molecules that easily sublimate, is heated to sublimate the atoms or molecules that easily sublimate from inside the gallium oxide compound film, thereby growing a single crystal of gallium oxide with a heat energy that is lower than a binding energy of gallium oxide.

27 Claims, 8 Drawing Sheets

(56) References Cited

U.S. PATENT DOCUMENTS

| | | |
|---|---|---|
| 6,897,560 B2 | 5/2005 | Ota et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,445,671 B2 * | 11/2008 | Sunkara et al. ............ 117/40 |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,619,301 B2 * | 11/2009 | Nishiura et al. ............ 257/631 |
| 7,674,650 B2 | 3/2010 | Akimoto et al. |
| 7,732,819 B2 | 6/2010 | Akimoto et al. |
| 2001/0026964 A1 | 10/2001 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0183832 A1* | 10/2003 | Ishida et al. ............ 257/94 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0115962 A1* | 6/2006 | Maeda ............ 438/460 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-223669 A | 8/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-093243 | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-037725 | 2/2008 |
| JP | 2008-156141 A | 7/2008 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconducters,", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment,", Appl. Phys. Lett. (Applied Physics Letter), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008 vol. 39, pp. 621-624.

Prins.M et al., "A Ferroelectric Transparent Thin-Film Transistor,", Appl. Phys. Lett. (Applied Physics Letters), Jun. 17, 1996, vol. No. 25, pp. 3650-3652.

Nakamura.M et al., "The phase relations in the $In_2O_3$-$Ga_2ZnO_4$-ZnO system at 1350°C,", Journal of Solid State Chemistry, Aug. 1, 1991, vol. 93, No. 2 pp. 298-315.

(56) References Cited

OTHER PUBLICATIONS

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultaviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187

Nomura.K et al., "Carrier transport in transparent oxide semiconductor with intrinsic structural randomness probed using single-crystalliine InGaO3(ZnO)5 films,", Appl. Phys. Lett. (Applied Physics Letters), Sep. 13, 2004 vol. No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry , 1998 vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 38, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on PLastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTs, ", IDW '09 : Proceedings of the 16th International Display Workshop, 2009, pp. 689-692.

Park.J et al., "Amorphous Indium-Gallium-Zinc Oxide Tfts and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,",AM-FDP '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13TH International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

(56) References Cited

OTHER PUBLICATIONS

Kimizuka.N. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A.), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. No. 3, pp. 1811-1816.

Nomura.K et al., "Amorphous Oxide Semiconductors for High-Performance Flexible Thin-Film Transistors,", Jpn. J. Appl. Phy. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States.", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001 vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6TH International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol.220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Tippins.H, "Optical Absorption and Photoconductivity in the Band Edge of (β-Ga2O3,", Phys. Rev. (Physical Review), Oct. 4, 1965, vol. 140, No. 1A, pp. A316-A319.

Orita.M et al., "Deep-ultraviolet transparent conductive β-Ga2O3 thin films,", Appl. Phys. Lett. (Applied Physics Letters), Dec. 18, 2000, vol. 77, No. 25, pp. 4166-4168.

Takagi.T et al., "Molecular Beam Epitaxy of High Magnesium Content Single-Phase Wurzite MgxZni-xO Alloys (x =0.5) and Their Application to Solar-Blind Region Photodetectors,", JPN. J. Appl. Phys. (Japanese Journal of Applied Physics), 2003, vol. 42, Part 2, No. 4B, pp. L401-L403.

* cited by examiner

HF-2000 200kV

| Element | Counts | K-Rel x,Si | K-Std x,Si | Wt % | Atom % |
| --- | --- | --- | --- | --- | --- |
| In-L | 15 | 1.718 | --- | 0.67 | 0.21 |
| Ga-K | 1923 | 1.425 | --- | 71.02 | 36.45 |
| Zn-K | 0 | 1.303 | --- | 0.00 | 0.00 |
| O -K | 272 | 4.018 | 4.239 | 28.32 | 63.34 |
| Total | | | | 100.00 | 100.00 |

MANUFACTURING METHOD OF GALLIUM OXIDE SINGLE CRYSTAL

BACKGROUND OF THE INVENTION

1. Field of the Invention

The present invention relates to a manufacturing method of a metal oxide single crystal, for example, a gallium oxide single crystal, and specifically relates to a method of obtaining a gallium oxide single crystal layer by growing a gallium oxide single crystal over a single crystal substrate that is not gallium oxide.

2. Description of the Related Art

Because gallium oxide single crystals (β type) have excellent light transmittance and have a large bandgap of about 5 eV (see Non-Patent Document 1, Non-Patent Document 2, and Non-Patent Document 3), they are expected as application materials for devices that operate stably under a high temperature, deep ultraviolet sensors, light-emitting devices, or the like. Also, manufacturing of a gallium oxide single crystal is described in Patent Document 1 and Patent Document 2.

[Reference]
[Patent Document]
[Patent Document 1] Japanese Published Patent Application No. 2008-37725
[Patent Document 2] Japanese Published Patent Application No. 2002-93243
[Non-Patent Document]
[Non-Patent Document 1]
H. H. Tippins, "Optical Absorption and Photoconductivity in the Band Edge of β-$Ga_2O_3$," Physical Review, 4 Oct. 1965, Vol. 140, A316-A319
[Non-Patent Document 2]
Masahiro Orita et al., Appl. Phys. Lett., 2000, Vol. 77 No. 25, p. 4166-4168
[Non-Patent Document 3]
T. Takagi et al., Jpn. J. Appl. Phys., 2003, Vol. 42, p. L401

SUMMARY OF THE INVENTION

A gallium oxide single crystal is manufactured by a Czochralski method (CZ method), a floating zone method (FZ method), or the like. However, since a melting point of gallium oxide is at a high temperature of 1900° C., a lot of heat energy is necessary to grow a single crystal, and a manufacturing apparatus that can withstand the high temperature is also necessary.

Consequently, there is a problem that cost of manufacturing gallium oxide is high. An object of an embodiment of the present invention is to provide a method of growing a single crystal of gallium oxide at a lower temperature than the melting point (1900° C.) of gallium oxide.

To form a crystal lattice of gallium oxide from an amorphous state, it is necessary to break bonds between oxygen atoms and gallium atoms and then rearrange the oxygen atoms and the gallium atoms. Therefore, it is necessary to add energy for breaking the bonds between the oxygen atoms and the gallium atoms from the outside. Gallium oxide has a large bandgap of about 5 eV, which originates from the atoms of gallium oxide having high binding energy. Consequently, heat energy for breaking the atomic bonds of gallium oxide is high.

However, in a gallium oxide compound containing atoms or molecules that easily sublimate, if oxygen atoms or gallium atoms are bonded to the atoms or molecules that easily sublimate, the atoms or molecules sublimate easily from inside the gallium oxide by adding from the outside a heat energy that is lower than the binding energy, and after they sublimate, a dangling bonds of the oxygen atoms and the gallium atoms occur. With this, rearrangement of the oxygen atoms and the gallium atoms becomes easy, and it is possible to generate crystallization of gallium oxide with lower energy than the binding energy.

In an embodiment of the present invention, a compound film (hereinafter referred to as "gallium oxide compound film") containing Ga atoms, O atoms, and atoms or molecules that easily sublimate, is heated to sublimate the atoms or molecules that easily sublimate from inside the gallium oxide compound film, thereby growing a single crystal of gallium oxide with a heat energy that is lower than a binding energy of gallium oxide. Note that the atoms and molecules that easily sublimate refer to elements that easily sublimate from inside the gallium oxide compound film, typically indium, zinc, or a halogen element such as fluorine.

In one aspect of the present invention disclosed in this specification, two single crystal substrates that are the same are used, and a method thereof is a manufacturing method of a gallium oxide single crystal, including the steps of forming a first metal oxide film over a first single crystal substrate and forming a first gallium oxide compound film over the first metal oxide film; forming a second metal oxide film over a second single crystal substrate and forming a second gallium oxide compound film over the second metal oxide film; and performing a heating treatment while the second single crystal substrate is positioned over the first gallium oxide compound film in a manner that the first gallium oxide compound film and the second gallium oxide compound film face each other with space between the first gallium oxide compound film and the second gallium oxide compound film, to sublimate a metal that is contained in the first gallium oxide compound film, and obtain a gallium oxide single crystal layer over the first single crystal substrate. Note that, the second metal oxide film is not always necessary. Furthermore, in the case that the first gallium oxide compound film is easily crystallized, the first metal oxide film is not always necessary.

With the above structure, a temperature of the heating treatment for obtaining the gallium oxide single crystal can be less than 1900° C., and the above problem is solved.

In the above structure, each of the first metal oxide film and the second metal oxide film that are formed on their respective single crystal substrates so as to be in contact thereto, is a zinc oxide film or an oxide film containing zinc oxide and one or both of indium and gallium, and is a thin film that becomes a nucleus for crystal growth when the heating treatment is performed, or a thin film that promotes crystal growth.

In the above structure, each of the first gallium oxide compound film and the second gallium oxide compound film is a film containing one or both of indium and zinc. Film thicknesses of the first gallium oxide compound film and the second gallium oxide compound film are made to be thicker than at least the first metal oxide film and the second metal oxide film, respectively.

In the above structure, by performing a heating treatment at about 1400° C. for example on a lamination of the first metal oxide film and the first gallium oxide compound film, there is crystal growth of a gallium oxide single crystal and sublimation of zinc or indium contained in the first gallium oxide compound film, and a gallium oxide single crystal layer is obtained. As a result, the film thickness of the gallium oxide single crystal layer obtained after the heat treatment is thinner than the thickness of the first gallium oxide compound film before the heating treatment.

Also, if the heating treatment at about 1400° C. is performed on the lamination of the first metal oxide film and the first gallium oxide compound film without placing the second single crystal substrate, the first gallium oxide compound film is sublimated and there is concern that the film itself will be lost. In preventing the loss of the first gallium oxide compound film, the second single crystal substrate for covering over the first gallium oxide compound film fulfills an important role.

A single crystal of gallium oxide can be grown over a single crystal substrate at a lower temperature than a melting point (1900° C.) of gallium oxide.

DETAILED DESCRIPTION OF THE INVENTION

Hereinafter, an embodiment of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiment.

(Embodiment 1)

In this embodiment, an example of a method of obtaining a single crystal of gallium oxide will be described below with reference to FIGS. 1A to 1D.

First, a first metal oxide film 101 and a first gallium oxide compound film 102 are formed and laminated over a first single crystal substrate 100.

As the first metal oxide film 101, a zinc oxide film that is obtained by a sputtering method is used, and the film thickness is to be 1 nm or more and 10 nm or less.

As the first gallium oxide compound film 102, an InGaO film, an InGaZnO film, a GaZnO film, or the like that is obtained by a sputtering method can be used, and the film thickness is to be 10 nm or more and 500 nm or less.

Figure 1A:
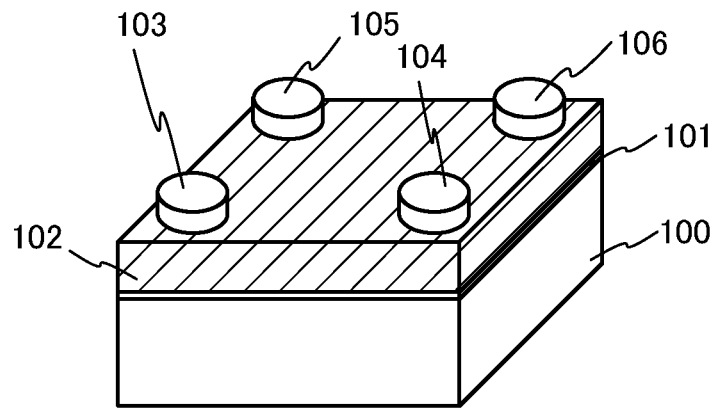
FIGS. 1A to 1D are a perspective view and cross-sectional views showing one aspect of the present invention.
Figure 1B:
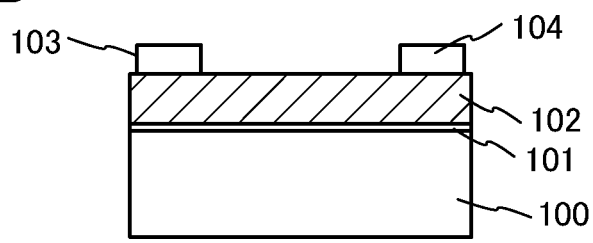

Then, spacing materials 103, 104, 105, and 106 are placed at four corners of the first gallium oxide compound film 102 over the first single crystal substrate 100, to maintain substrate spacing. A perspective view at this stage corresponds to FIG. 1A, and a corresponding cross-sectional view is shown in FIG. 1B. Each of the spacing materials 103, 104, 105, and 106 may be formed of the same material as that of the first single crystal substrate 100, or of a different material from that of the single crystal substrate as long as it has a high melting point that is higher than the melting point of the single crystal substrate.

Furthermore, a second single crystal substrate 200 is prepared, which is to be placed over the first single crystal substrate 100.

Over the second single crystal substrate 200 also, a second metal oxide film 201 and a second gallium oxide compound film 202 are formed and laminated. Note that the second metal oxide film 201 is not always necessary. Furthermore, in the case that the first gallium oxide compound film 102 is easily crystallized, the first metal oxide film 101 is not always necessary. Also, compositions of the first gallium oxide compound film 102 and the second gallium oxide compound film 202 are preferably equivalent.

As the second metal oxide film 201, a zinc oxide film that is obtained by a sputtering method is used, and the film thickness is to be 1 nm or more and 10 nm or less.

As the second gallium oxide compound film 202, an InGaO film, an InGaZnO film, a GaZnO film, or the like that is obtained by a sputtering method can be used, and the film thickness is to be 10 nm or more and 500 nm or less.

Figure 1C:
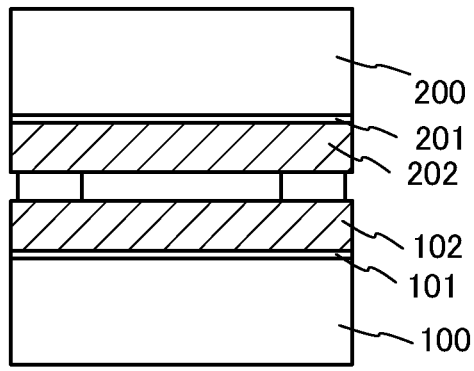
Figure 1D:
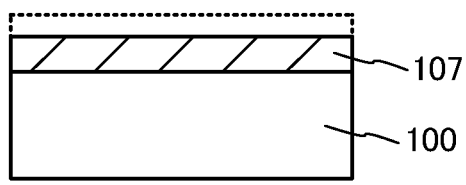

Then, as shown in FIG. 1C, the second single crystal substrate 200 is positioned over the first single crystal substrate 100 so that the first gallium oxide compound film 102 and the second gallium oxide compound film 202 face each other with certain space therebetween created by the spacing materials 103 and 104.

Next, a heating treatment is performed at 1000° C. or higher and lower than 1900° C. However, after maintaining the temperature at 1000° C. or higher and lower than 1900° C. for a predetermined time period, cooling to room temperature is to be done naturally. Note that, for each of the first single crystal substrate 100 and the second single crystal substrate 200, a single crystal substrate that can withstand this heating treatment is to be used.

By performing the heating treatment, crystal growth occurs while a metal (zinc or indium) contained in the first gallium oxide compound film 102 is removed (for example, sublimated) from inside the film, and a gallium oxide single crystal layer 107 that is in contact with the first single crystal substrate 100 can be obtained. Note that in FIG. 1D, a dotted line shows the first gallium oxide compound film before the heating treatment, and it is shown that the gallium oxide single crystal layer 107 with a thinner film thickness than the first gallium oxide compound film can be obtained after the heating treatment.

Note that by the above heating treatment, there are cases in which the second gallium oxide compound film 202 provided over the second single crystal substrate 200 is lost.

An embodiment of the present invention having the above structure will be explained in more detail in the example below.

Example 1

In this example, as each of the first single crystal substrate and the second single crystal substrate, an yttria-stabilized zirconia substrate with a plane orientation of (1 1 1), which is a so-called YSZ substrate (substrate size of 10 mm×10 mm, thickness of 0.5 mm), is used.

Over each of the first single crystal substrate and the second single crystal substrate, a zinc oxide film with a film thickness of 2 nm and an InGaZnO film with a film thickness of 100 nm were laminated.

Formation of the zinc oxide film was performed with a film formation pressure of 0.4 Pa, a power of 0.5 kW, an argon flow rate of 10 sccm, and an oxygen flow rate of 5 sccm.

Formation of the InGaZnO film was performed using an oxide target of $In_2O_3$:$Ga_2O_3$:$ZnO$=1:1:1 [molar ratio], with a film formation pressure of 0.4 Pa, a power of 0.5 kW using a DC power source, an argon flow rate of 10 sccm, and an oxygen flow rate of 5 sccm. The InGaZnO film immediately after being formed is an amorphous film.

Furthermore, the spacing materials had a height of 0.5 mm, and the first single crystal substrate 100 and the second single crystal substrate 200 were arranged in a manner shown in FIG. 1C.

Then, a heating treatment was performed, and a single crystal layer of gallium oxide with a film thickness of about 70 nm was obtained in a manner that was in contact with the first single crystal substrate.

Figure 2:
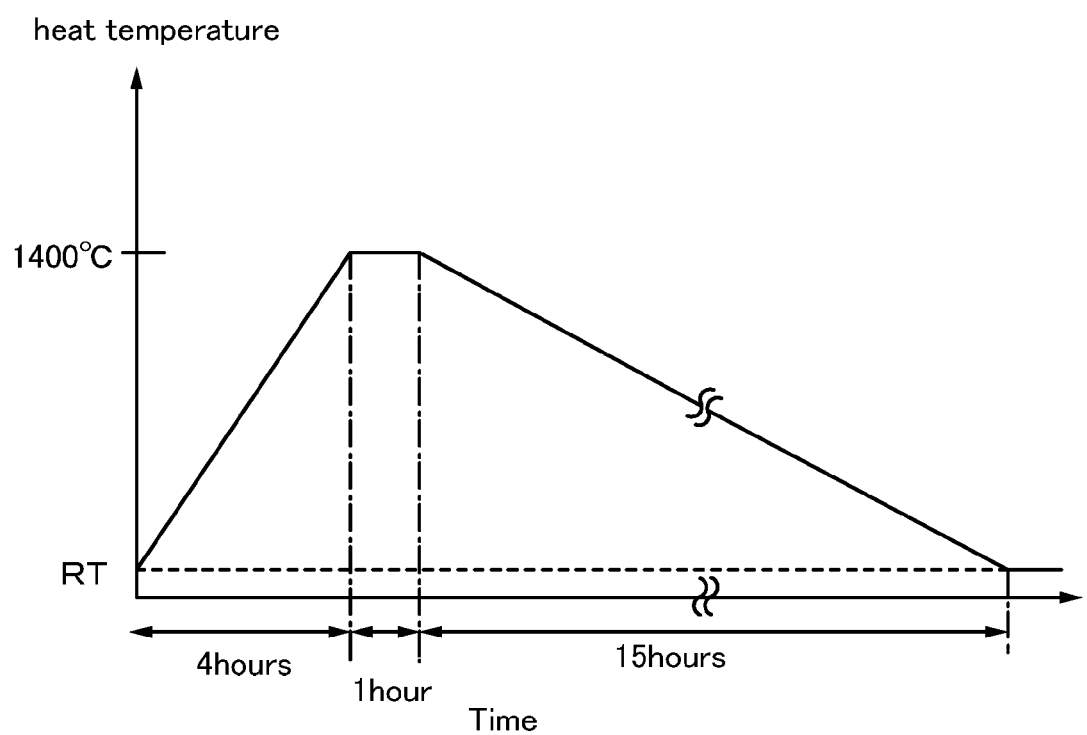
FIG. 2 is a graph showing a condition of a heating treatment.

Conditions of the heating treatment were use of a high speed heating electric furnace (Product Name: NHA-3045F), and performing the heating treatment in the atmosphere at a temperature of 1400° C. for 1 hour. Note that, details of the heating treatment conditions are shown in FIG. 2.

Figure 3:
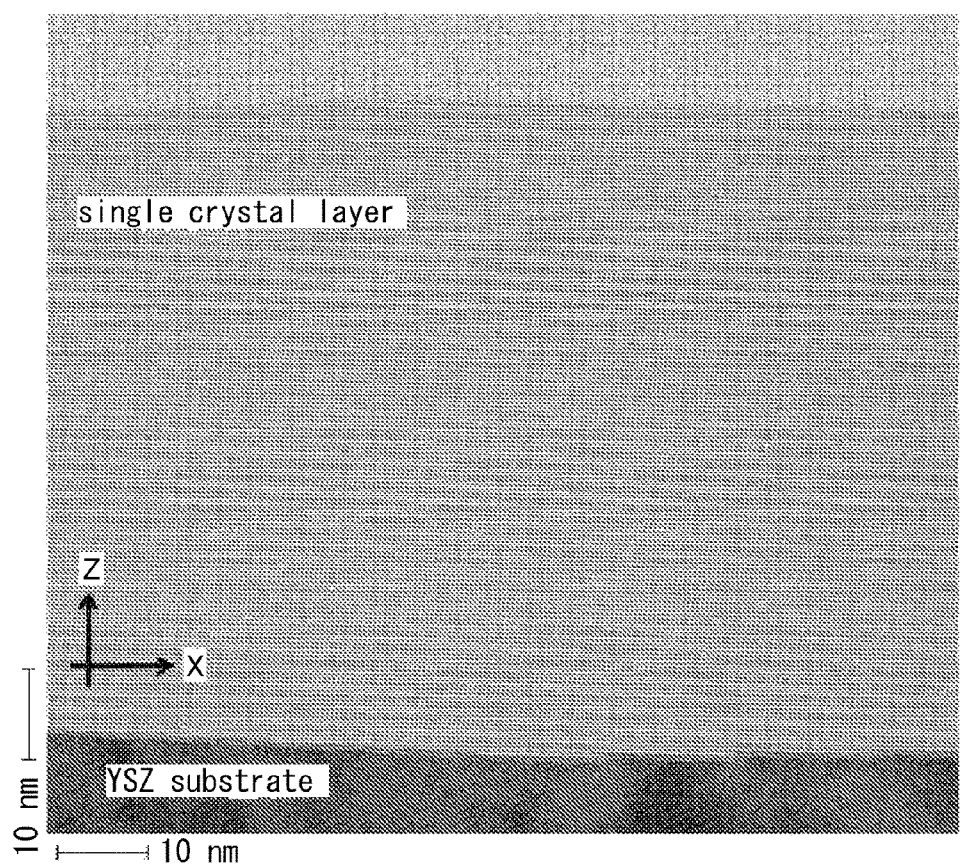
FIG. 3 is a cross-sectional TEM image of a single crystal layer.

FIG. 3 shows a cross-sectional TEM image of a crystallized region. Lattice images are lined up neatly and horizontally in a film thickness direction of about 70 nm, and it is apparent that there is growth of a single crystal.

Figure 4:
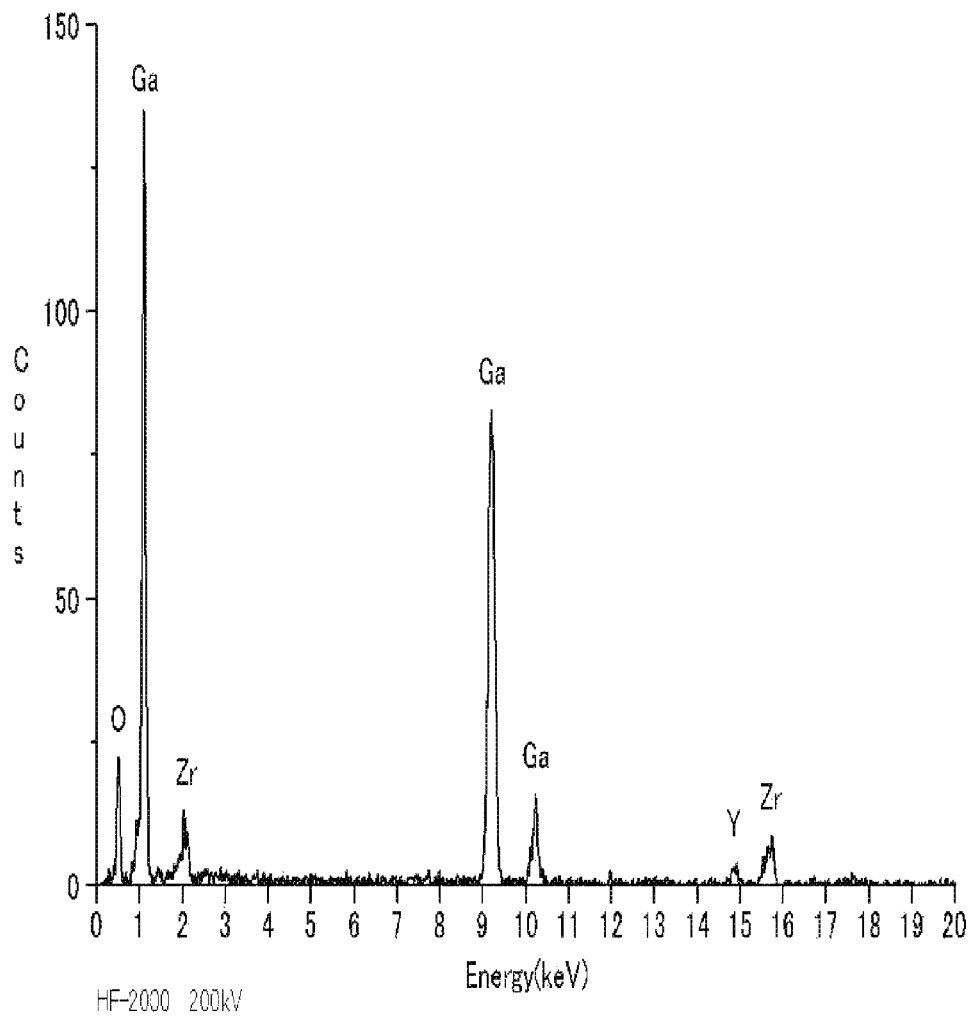
FIG. 4 is a graph showing a result of an EDX analysis of a single crystal layer.

FIG. 4 shows a result of an energy dispersive X-ray (EDX) analysis of the obtained crystal layer. From this, it is apparent that a concentration ratio of Ga atoms to O atoms is about 2:3. That is, it indicates that $Ga_2O_3$ was formed.

Figure 5:
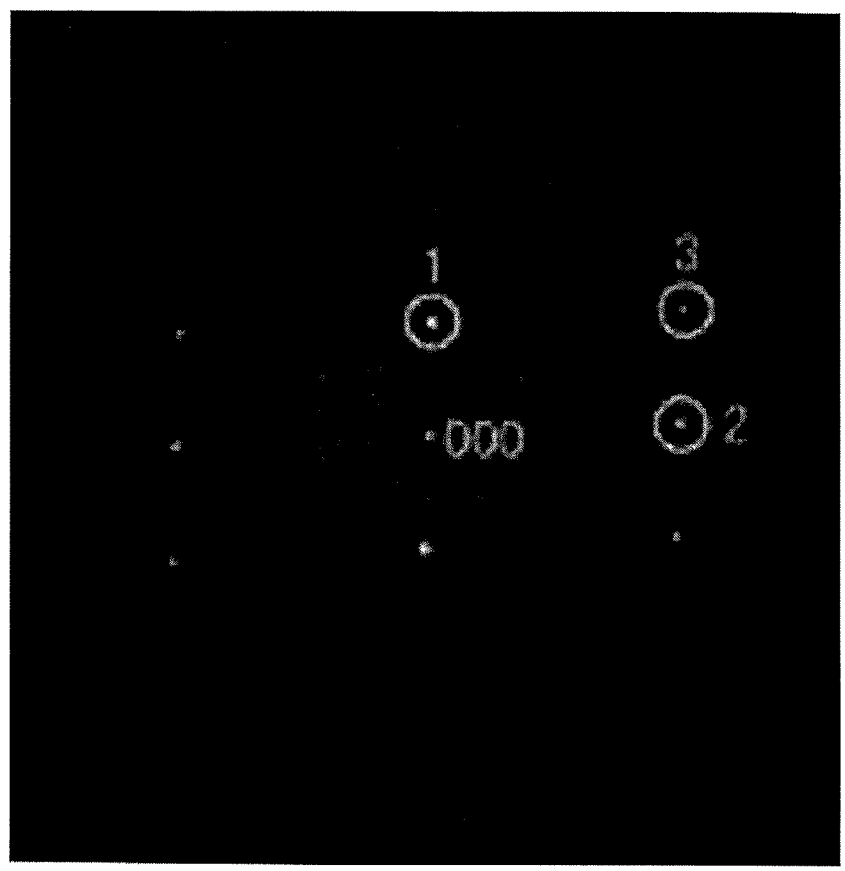
FIG. 5 is a figure showing an electron beam diffraction pattern of a single crystal layer.

FIG. 5 shows an electron beam diffraction pattern of a cross section of a single crystal layer, and analysis results thereof are shown in Table 1 and Table 2

TABLE 1 lattice plane distance

| point | h | k | l | d value (nm) | measured d value (nm) |
|---|---|---|---|---|---|
| 1 | 1 | 2 | 1 | 0.4686 | 0.468 |
| 2 | 4 | −1 | −1 | 0.2111 | 0.208 |
| 3 | 5 | −1 | 0 | 0.1873 | 0.184 |

TABLE 2 plane angle

| | calculated (°) | measured (°) |
|---|---|---|
| ∠ 102 | 85.7 | 85.4 |
| ∠ 103 | 62.2 | 62.1 |

With this, it was also confirmed from the analysis result of electron beam diffraction that the obtained single crystal was $Ga_2O_3$. Furthermore, it was confirmed that the plane orientation of a surface of $Ga_2O_3$ was (1 0 1), and that there was perpendicular growth with respect to a substrate surface with this plane orientation. It was also confirmed from a result of X-ray diffraction (XRD) analysis that a crystal structure of the obtained $Ga_2O_3$ was base-centered monoclinic and β-$Ga_2O_3$. That is, $Ga_2O_3$ (1 0 1) grows with respect to the YSZ (1 1 1) substrate.

Also, as a comparative example, when the same experiment was performed using a sapphire substrate as the second single crystal substrate, a film over the YSZ substrate serving as the first single crystal substrate was lost, and a single crystal layer of gallium oxide was not obtained. From this experiment result, it can be said that the same material is preferably used for the first single crystal substrate and the second single crystal substrate. As each of the single crystal substrates, a sapphire ($Al_2O_3$) substrate, an aluminum nitride (AlN) substrate, or the like which can withstand a heat treatment at a high temperature can be used alternatively to an yttria-stabilized zirconia (YSZ) substrate.

Also, as a comparative example, when an InGaZnO film with a film thickness of 100 nm formed over the first single crystal substrate and an InGaZnO film with a film thickness of 100 nm formed over the second single crystal substrate were made to be in contact with each other by not providing spacing materials, and then subjected to the same heating treatment, Zn and In remained in the film, and a single crystal layer of gallium oxide was not obtained. From this experiment result, it can be said that in forming a single crystal layer of gallium oxide, it is necessary that there is space between the pair of substrates by providing the spacing materials between the first single crystal substrate and the second single crystal substrate.

Example 2

In this example, a result of performing an experiment under conditions with different target composition ratio and heat treatment temperature from those in Example 1 will be described. Note that, other conditions are the same as those in Example 1; therefore, descriptions there will be omitted.

In this example, an InGaZnO film was formed using an oxide target of $In_2O_3$:$Ga_2O_3$:$ZnO$=1:1:10 [molar ratio], with a film formation pressure of 0.4 Pa, a power of 0.5 kW using a DC power source, an argon flow rate of 10 sccm, and an oxygen flow rate of 5 sccm. Note that the InGaZnO film immediately after being formed is an amorphous film.

Figure 6:
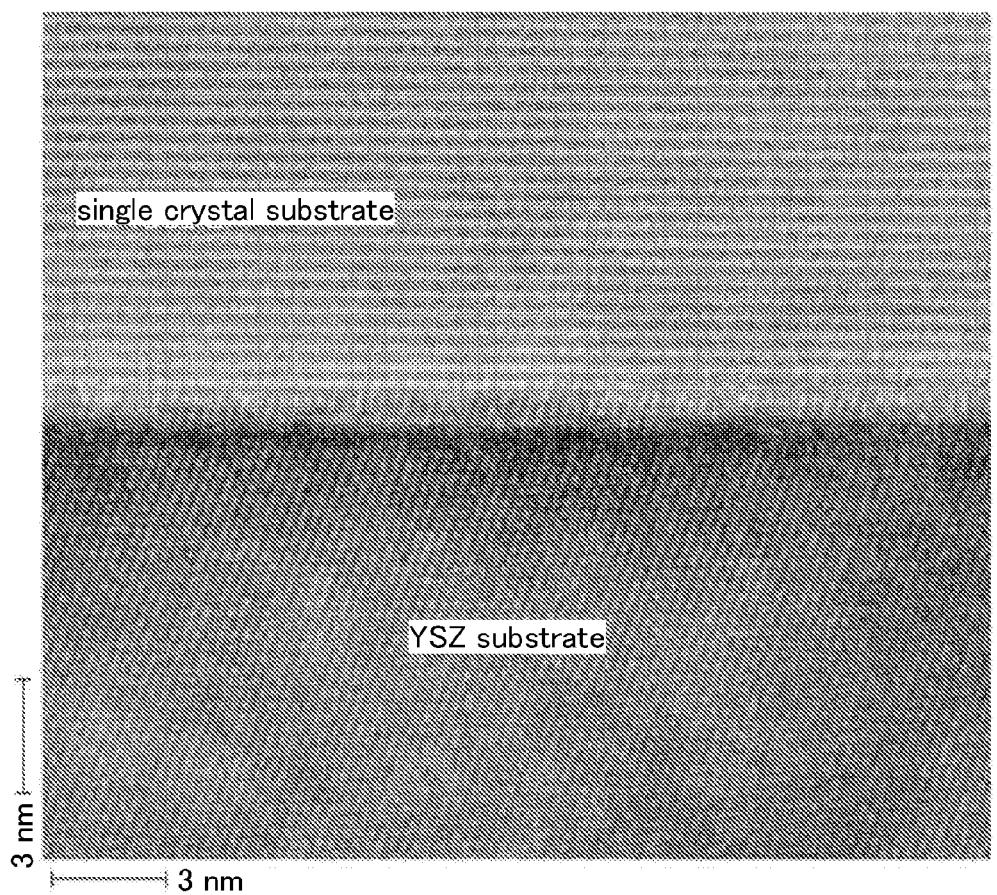
FIG. 6 is a cross-sectional TEM image of a single crystal layer.

Also, a maintained temperature of the heating treatment was set at 1350° C. A cross-sectional TEM image of a single crystal layer of gallium oxide obtained by the heating treatment is shown in FIG. 6. It can be observed that lattice images are lined up horizontally and that a single crystal is growing.

Figure 7:
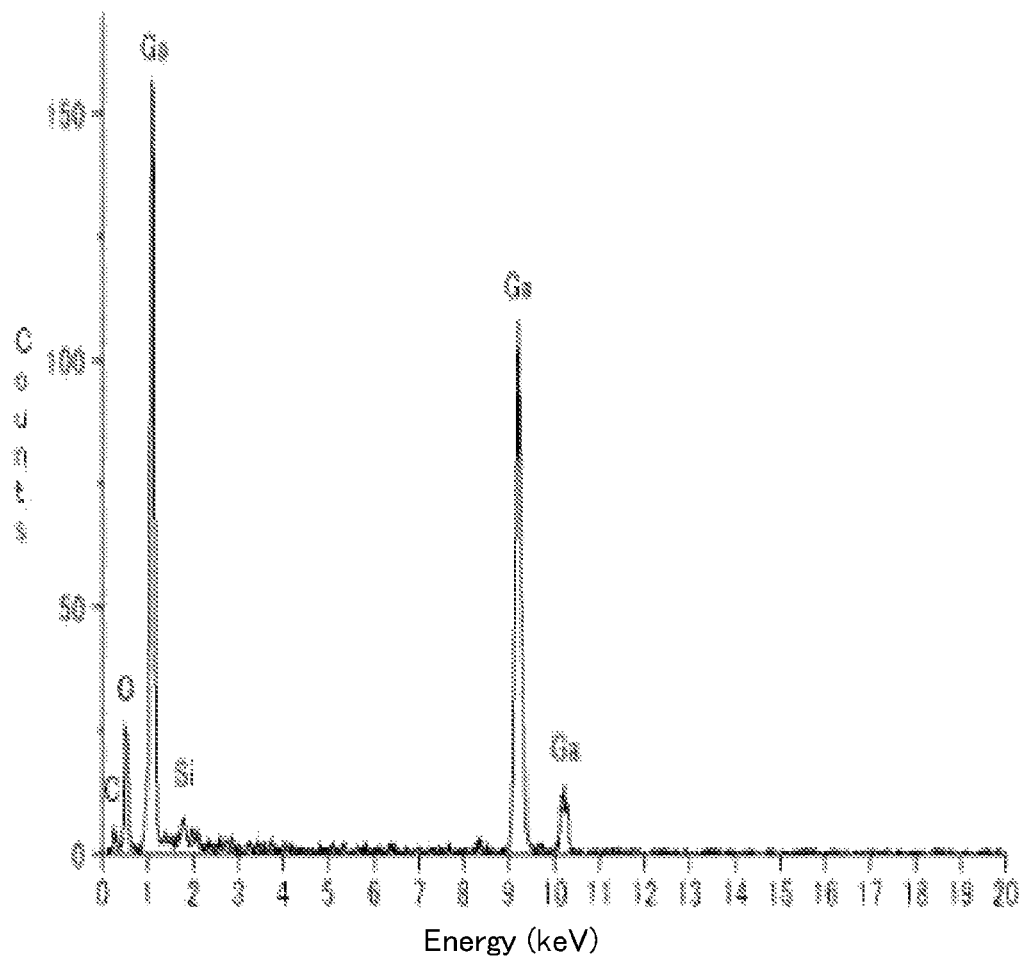
FIG. 7 is a graph showing a result of an EDX analysis of a single crystal layer.

FIG. 7 shows a result of an EDX analysis of the obtained crystal layer. It was indicated from a concentration ratio of Ga atoms and O atoms that $Ga_2O_3$ was formed.

Figure 8:
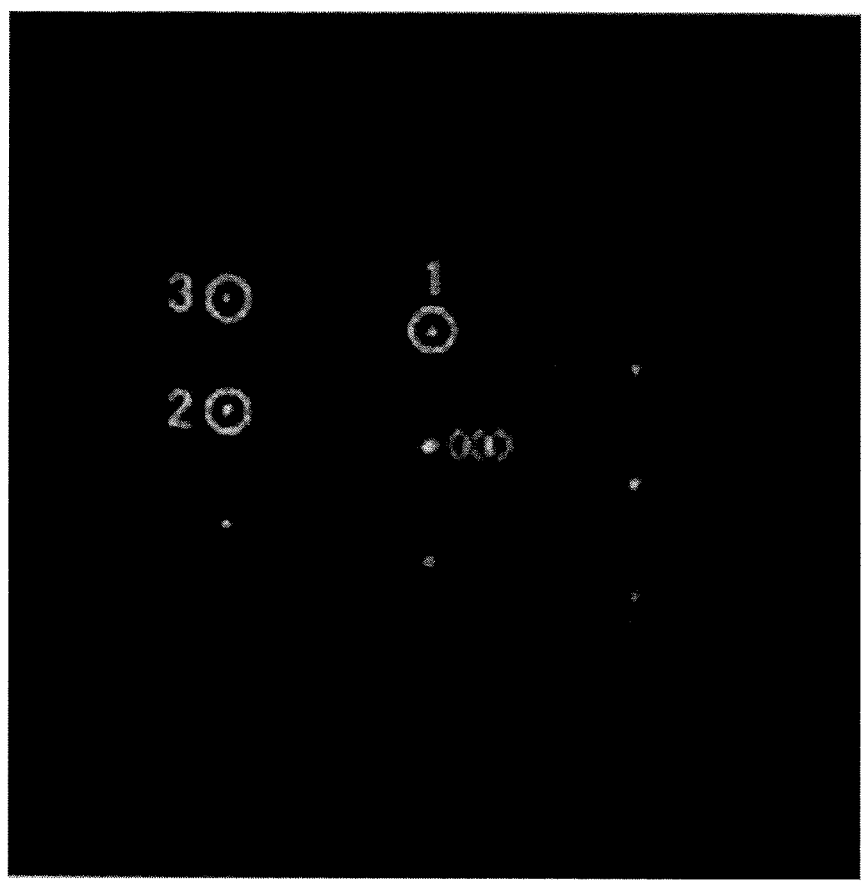
FIG. 8 is a figure showing an electron beam diffraction pattern of a single crystal layer.

FIG. 8 shows an electron beam diffraction pattern of a cross section of a single crystal layer, and analysis results thereof are shown in Table 3 and Table 4.

TABLE 3 lattice plane distance

| point | h | k | l | d value (nm) | measured d value (nm) |
|---|---|---|---|---|---|
| 1 | −2 | 0 | 1 | 0.4687 | 0.467 |
| 2 | 1 | 1 | 1 | 0.2550 | 0.255 |
| 3 | 1 | 1 | 2 | 0.2101 | 0.209 |

TABLE 4 plane angle

| | calculated (°) | measured (°) |
|---|---|---|
| ∠ 102 | 80.6 | 80.8 |
| ∠ 103 | 54.4 | 55.2 |

With this, it was also confirmed from the analysis results of the electron beam diffraction that the obtained single crystal was $Ga_2O_3$. Also, it was confirmed that the plane orientation of a surface of $Ga_2O_3$ was (−2 0 1), and that there was perpendicular growth with this plane orientation with respect to the substrate. However, it was confirmed that this crystal growth plane orientation was different from the plane orientation (1 0 1) of single crystal $Ga_2O_3$ that was crystallized using a target of $In_2O_3:Ga_2O_3:ZnO=1:1:1$ [molar ratio]. Furthermore, it was confirmed from a result of X-ray diffraction (XRD) analysis that a crystal structure of the obtained $Ga_2O_3$ was base-centered monoclinic and $\beta$-$Ga_2O_3$. That is, $Ga_2O_3$ (−2 0 1) grows with respect to the YSZ (1 1 1) substrate.

Furthermore, as a comparative example, when the maintained temperature of the heating treatment was changed from 1350° C. to 1400° C., the film remaining on the first single crystal substrate became patchy and sparse. Since $Ga_2O_3$ is to be manufactured by sublimating In and Zn from the InGaZnO film, it is thought that density of Zn and In inside the InGaZnO film to be formed is preferably low. This is because it can be thought that the higher the density of In and Zn inside the InGaZnO film, the lower the film density will be after they are sublimated.

This application is based on Japanese Patent Application serial no. 2010-056118 filed with Japan Patent Office on Mar. 12, 2010, the entire contents of which are hereby incorporated by reference.

What is claimed is:

1. A manufacturing method of a gallium oxide single crystal, comprising the steps of:
   forming a first metal oxide film over a first single crystal substrate;
   forming a first gallium oxide compound film comprising a metal, over the first metal oxide film;
   forming a second metal oxide film over a second single crystal substrate;
   forming a second gallium oxide compound film over the second metal oxide film; and
   performing a heating treatment while the second single crystal substrate is positioned over the first gallium oxide compound film in a manner that the first gallium oxide compound film and the second gallium oxide compound film face each other with space between the first gallium oxide compound film and the second gallium oxide compound film, to obtain a gallium oxide single crystal over the first single crystal substrate from at least a part of the first gallium oxide compound film.

2. The manufacturing method of a gallium oxide single crystal according to claim 1, wherein each of the first metal oxide film and the second metal oxide film is a zinc oxide film or an oxide film containing zinc oxide and one or both of indium and gallium.

3. The manufacturing method of a gallium oxide single crystal according to claim 1, wherein the metal is at least one of indium and zinc.

4. The manufacturing method of a gallium oxide single crystal according to claim 1, wherein the second gallium oxide compound film comprises at least one of indium and zinc.

5. The manufacturing method of a gallium oxide single crystal according to claim 1, wherein the first single crystal substrate and the second single crystal substrate are formed using the same material.

6. The manufacturing method of a gallium oxide single crystal according to claim 1, wherein compositions of the first gallium oxide compound film and the second gallium oxide compound film are the same.

7. The manufacturing method of a gallium oxide single crystal according to claim 1, wherein each of the first single crystal substrate and the second single crystal substrate is an yttria-stabilized zirconia substrate, a sapphire substrate, or an aluminum nitride substrate.

8. The manufacturing method of a gallium oxide single crystal according to claim 1, wherein the gallium oxide single crystal is obtained by sublimating the metal in the first gallium oxide compound film by the heating treatment.

9. The manufacturing method of a gallium oxide single crystal according to claim 1, wherein the heating treatment is performed at a temperature of equal to or higher than 1000° C. to lower than 1900° C.

10. A manufacturing method of a gallium oxide single crystal, comprising the steps of:
    forming a first metal oxide film over a first single crystal substrate;
    forming a first gallium oxide compound film comprising a metal, over the first metal oxide film;
    forming a second gallium oxide compound film over a second single crystal substrate; and
    performing a heating treatment while the second single crystal substrate is positioned over the first gallium oxide compound film in a manner that the first gallium oxide compound film and the second gallium oxide compound film face each other with space between the first gallium oxide compound film and the second gallium oxide compound film, to obtain a gallium oxide single crystal over the first single crystal substrate from at least a part of the first gallium oxide compound film.

11. The manufacturing method of a gallium oxide single crystal according to claim 10, wherein the first metal oxide film is a zinc oxide film or an oxide film containing zinc oxide and one or both of indium and gallium.

12. The manufacturing method of a gallium oxide single crystal according to claim 10, wherein the metal is at least one of indium and zinc.

13. The manufacturing method of a gallium oxide single crystal according to claim 10, wherein the second gallium oxide compound film comprises at least one of indium and zinc.

14. The manufacturing method of a gallium oxide single crystal according to claim 10, wherein the first single crystal substrate and the second single crystal substrate are formed using the same material.

15. The manufacturing method of a gallium oxide single crystal according to claim 10, wherein compositions of the first gallium oxide compound film and the second gallium oxide compound film are the same.

16. The manufacturing method of a gallium oxide single crystal according to claim 10, wherein each of the first single crystal substrate and the second single crystal substrate is a yttria-stabilized zirconia substrate, a sapphire substrate, or an aluminum nitride substrate.

17. The manufacturing method of a gallium oxide single crystal according to claim 10, wherein the gallium oxide single crystal is obtained by sublimating the metal in the first gallium oxide compound film by the heating treatment.

18. The manufacturing method of a gallium oxide single crystal according to claim 10, wherein the heating treatment is performed at a temperature of equal to or higher than 1000° C. to lower than 1900° C.

19. A manufacturing method of a gallium oxide single crystal comprising the steps of:
    forming a first gallium oxide compound film comprising a metal, over a first single crystal substrate;
    forming a second gallium oxide compound film over a second single crystal substrate; and performing a heating treatment while the second single crystal substrate is positioned over the first gallium oxide compound film in a manner that the first gallium oxide compound film and the second gallium oxide compound film face each other with space between the first gallium oxide compound film and the second gallium oxide compound film, to obtain a gallium oxide single crystal over the first single crystal substrate from at least a part of the first gallium oxide compound film.

20. The manufacturing method of a gallium oxide single crystal according to claim 19, wherein the metal is at least one of indium and zinc.

21. The manufacturing method of a gallium oxide single crystal according to claim 19, wherein the second gallium oxide compound film comprises at least one of indium and zinc.

22. The manufacturing method of a gallium oxide single crystal according to claim 19, wherein the first single crystal substrate and the second single crystal substrate are formed using the same material.

23. The manufacturing method of a gallium oxide single crystal according to claim 19, wherein compositions of the first gallium oxide compound film and the second gallium oxide compound film are the same.

24. The manufacturing method of a gallium oxide single crystal according to claim 19, wherein each of the first single crystal substrate and the second single crystal substrate is an yttria-stabilized zirconia substrate, a sapphire substrate, or an aluminum nitride substrate.

25. The manufacturing method of a gallium oxide single crystal according to claim 19, wherein the gallium oxide single crystal is obtained by removing the metal in the first gallium oxide compound film by the heating treatment.

26. The manufacturing method of a gallium oxide single crystal according to claim 25, wherein the removing of the metal is performed by sublimating the metal.

27. The manufacturing method of a gallium oxide single crystal according to claim 19, wherein the heating treatment is performed at a temperature of equal to or higher than 1000° C. to lower than 1900° C.

* * * * *